United States Patent [19]
Enderich

[11] Patent Number: 5,714,852
[45] Date of Patent: Feb. 3, 1998

[54] THREE STATE SWITCH DETECTION USING CURRENT SENSING

[75] Inventor: Mark A. Enderich, Riverview, Mich.

[73] Assignee: United Technologies Automotive, Inc., Dearborn, Mich.

[21] Appl. No.: 713,475

[22] Filed: Sep. 13, 1996

[51] Int. Cl.⁶ .................................. H02P 1/22
[52] U.S. Cl. .................. 318/256; 318/280; 318/112; 318/543
[58] Field of Search ..................... 318/256, 264, 318/265, 266, 280, 286, 287, 291, 293, 112, 543

[56] References Cited

U.S. PATENT DOCUMENTS

| | | |
|---|---|---|
| 3,229,181 | 1/1966 | Evans . |
| 3,305,718 | 2/1967 | Waldron . |
| 3,731,170 | 5/1973 | Emmert . |
| 3,748,557 | 7/1973 | Mittelstaedt . |
| 4,476,416 | 10/1984 | Licata et al. ............................ 318/283 |
| 4,896,084 | 1/1990 | Maue et al. ............................ 318/280 |
| 5,369,343 | 11/1994 | Niemela ................................. 318/280 |

Primary Examiner—Bentsu Ro
Attorney, Agent, or Firm—Howard & Howard

[57] ABSTRACT

A three state switch detection circuit converts a three state input to a two-bit binary output readable by a micro-controller or other digital logic. The circuit utilized complementary NPN and PNP transistors having coupled emitters and coupled bases connected by a resistor. The collector of the PNP transistor is connected by a resistor to ground while a complementary resistor ties the collector of the NPN transistor to $V_{BATT}$. Additional circuitry preferably converts the voltage output from the collectors to a suitable voltage level readable by the micro-controller or other digital logic device.

15 Claims, 1 Drawing Sheet

THREE STATE SWITCH DETECTION USING CURRENT SENSING

BACKGROUND OF THE INVENTION

This invention relates to a circuit for converting a single three state input to a two-bit binary output which is particularly useful for motor driven features having stored memory settings.

Many modern vehicles include memory settings for motor driven features, such as the side view mirrors. When the driver selects a memory setting, the micro-controller sets the mirrors to a stored angle previously selected by the driver. The mirrors can also be adjusted manually utilizing a switch, typically a joystick. Each mirror includes a first motor for adjusting the minor angle up and down and a second motor for adjusting the mirror angle left and right. Each motor has a common input, which is common to all of the motors, and a motor input which can be used to control the individual motor. The common input may be low (tilt right or down), high (tilt left or up) or an open circuit (no motion).

In order to co-exist with the memory function, the switch is input to the microcontroller or other digital-level logic device. If the switch is high or low, indicating that it is being manually adjusted, the micro-controller will not move the minor to the memory setting. The micro-controller will only adjust the mirrors to the memory setting when the manual switch is in the open circuit position. Because the micro-controller can only receive binary inputs, an analog to digital converter is typically connected to a voltage divider circuit to convert the three state switch (high, low, open) to a binary output readable by the microcontroller. However, this method requires the addition of an expensive analog to digital converter.

SUMMARY OF THE INVENTION

The present invention provides an inexpensive circuit for converting a three state input to a two-bit binary output readable by a micro-controller. The circuit preferably utilizes complementary NPN and PNP transistors. The emitters of the transistors are coupled to the input from the three state switch and the bases of the transistors are coupled to a voltage divider which provides a reference voltage of approximately one-half the battery voltage, $V_{BATT}$. A current sensing resistor connects the bases and emitters of the transistors to convert the switch current into a voltage for use in determining if the current is greater than a threshold.

A resistor ties the collector of the PNP transistor to ground while a complementary resistor ties the collector of the NPN transistor to $V_{BATT}$. A pair of voltage divider circuits convert the voltage output from the collectors to a voltage readable by the micro-controller.

When the input is connected to $V_{BATT}$, sufficient positive current through the current sensing resistor generates a sufficient negative base-emitter voltage across the transistors that the PNP transistor turns on and saturates, bringing the collector voltage of the PNP transistor to $V_{BATT}$. Simultaneously, the NPN transistor switches off, also permitting the collector voltage of the NPN transistor to be pulled to $V_{BATT}$. These voltages are preferably reduced to the proper micro-controller voltage levels and indicate to the micro-controller that the switch is in the $V_{BATT}$ position.

When the switch is in the ground position, the converse occurs. The current out of the three state converting circuit generates a sufficient positive base-emitter voltage to turn off the PNP transistor, permitting the collector of the PNP transistor to be pulled to ground. Simultaneously, the NPN transistor turns on, bringing the collector of the NPN transistor to ground. The collector voltages are converted to a micro-controller voltage level and read as a binary input to the micro-controller which indicates that the switch is in the ground position.

When the switch is in the open circuit position, both transistors will be switched off. The collector of the PNP transistor will be pulled to ground, while the collector of the NPN transistor will be pulled to $V_{BATT}$. These collector voltages will be converted to micro-controller voltage levels and read as a binary input to the micro-controller, thereby indicating that the switch is in the open circuit position.

BRIEF DESCRIPTION OF THE DRAWING

The above, as well as other advantages of the present invention, will become readily apparent to those skilled in the art from the following detailed description of a preferred embodiment when considered in the light of the accompanying drawings in which.

DETAILED DESCRIPTION OF A PREFERRED EMBODIMENT

Figure 1:
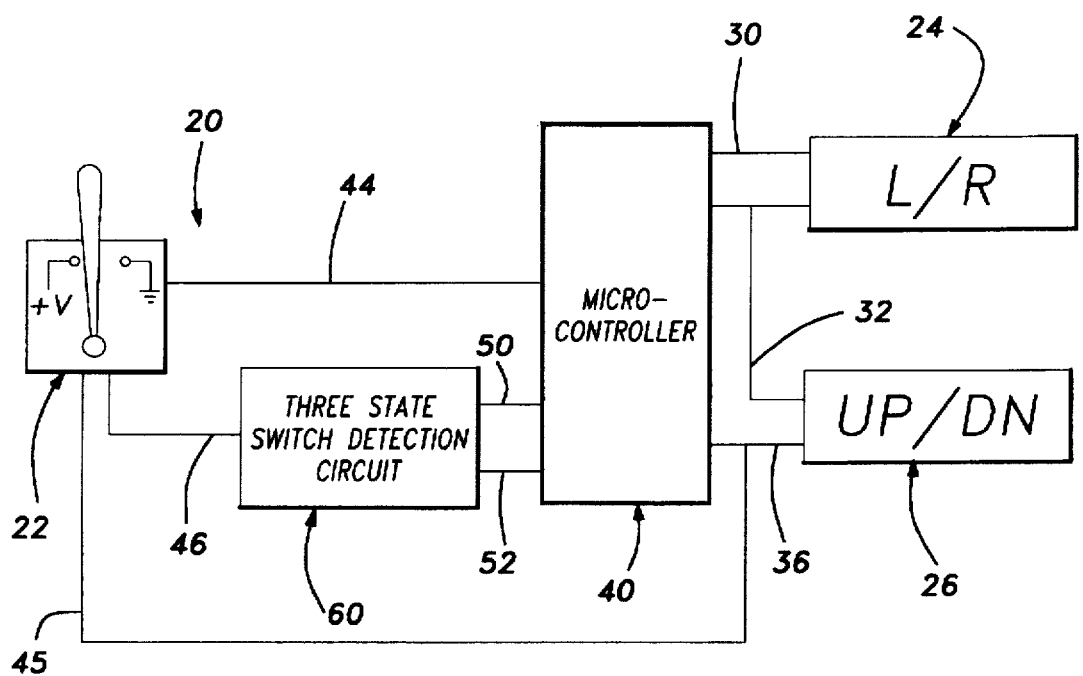
FIG. 1 is a schematic of a mirror control circuit utilizing the three state switch detection circuit of the present invention.

A mirror control circuit 20 is shown generally in FIG. 1 including a switch 22, which is preferably a joystick 22, controlling a first motor 24 which controls the left and fight tilt and a second motor 26 which controls the up and down tilt of a mirror. Motor 24 includes a motor input 30 and a common input 32. Motor 26 includes a motor input 36 and the common input 32.

To tilt the mirror to the right, the common input 32 is driven low (or ground) while the motor input 30 to the motor 24 is high ($V_{BATT}$). Conversely, to tilt the mirror to the left, the common input 32 is driven high while the motor input 30 to the motor 24 is low. While operating the motor 24 to tilt the mirror to the right or left, the motor input 36 to the motor 26 is open.

Similarly, to move the mirror down, the motor input 36 to the motor 26 is high while the common input 32 is low and the motor input 30 to the motor 24 is open. Conversely, to move the mirror up, the motor input 36 to the motor 26 is low while the common input 32 is high and the motor input 30 to the motor 24 is open. While operating the motor 26 to tilt the mirror up or down, the motor input 30 to the motor 24 is open.

A micro-controller 40 controls the inputs to the motors 24, 26 in order to activate the memory settings for the mirrors, i.e. a first driver will have a first memory setting for the left and right angle and up and down tilt of the mirror which will be saved by the micro-controller 40. When the first memory setting is selected by pressing a first memory button, the micro-controller 40 will restore the tilt and angle of the mirror to the previously stored settings by controlling the inputs to motor 24 and motor 26. Other memory settings are stored and selected by other drivers.

In order to also provide manual control of the motor 24 and motor 26, the output from the joystick 22 is connected to the micro-controller 40. Motor control lines 44 and 45 are connected from the joystick 22 to motor 24 and motor 26. Connections in the joystick 22 are shown only as they relate to a common line 46. The common line 46 from the joystick 22 is a tri state line which is connected either to $V_{BATT}$ in the up or left position, to ground in the right or down position, or an open circuit in the central position.

While the micro-controller 40 is receiving a high or low input on common line 46, the micro-controller 40 will not adjust the motor 24 or the motor 26 to activate the memory settings, but will reflect the state present on common line 46 (high or low) at the output on the common line 32. Microcontroller 40 will only adjust the mirror to the memory setting when the joystick 22 is in the central, open position, i.e. the joystick 22 is not currently being manually adjusted. Further, while adjusting the mirror to the memory setting, the micro-controller 40 will cease adjustment if the joystick 22 is moved from the central open position to permit a manual override.

Because the micro-controller 40 can only read binary inputs, the tri state common line 46 is converted to two binary lines 50, 52 by a three state switch detection circuit 60. By way of illustration only, the tri state common line 46 and binary output lines 50 and 52 preferably have the following truth table:

| COMMON LINE 46 | OUTPUT 50 | OUTPUT 52 |
| --- | --- | --- |
| HIGH | HIGH | HIGH |
| OPEN | LOW | HIGH |
| LOW | LOW | LOW |

Figure 2:
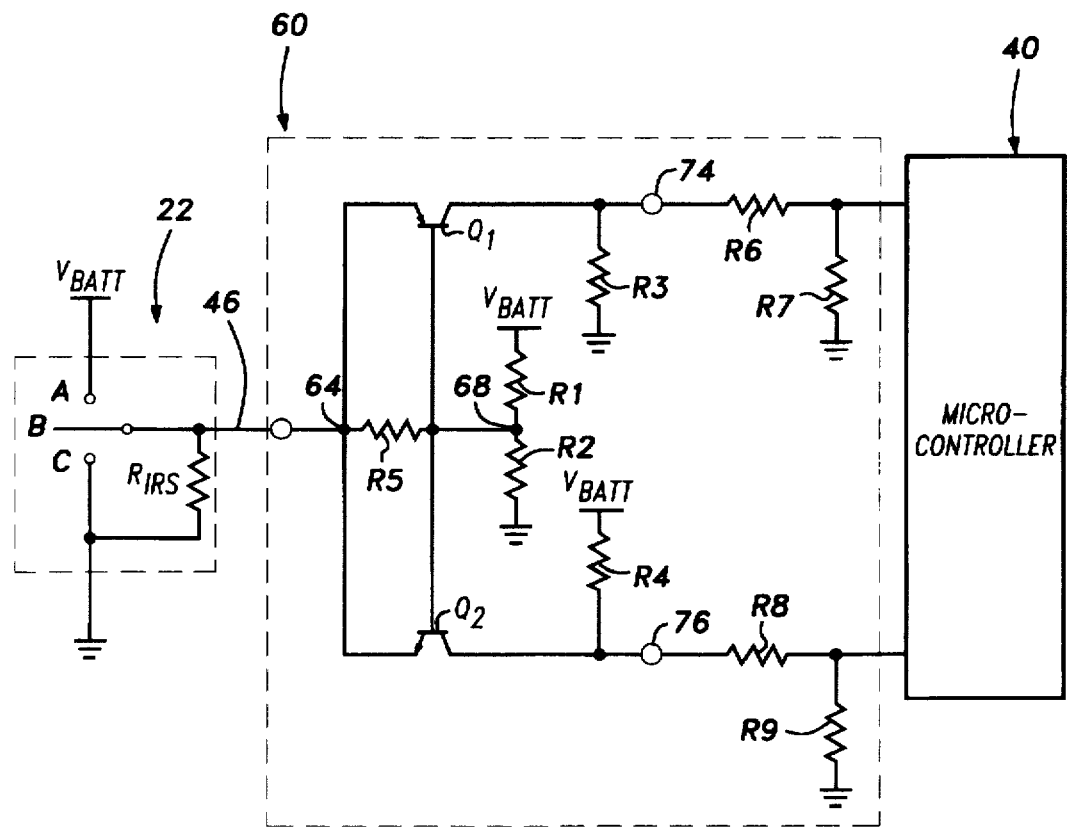
FIG. 2 is a schematic of the three state switch detection circuit of FIG. 1.

The three state switch detection circuit 60 is shown in more detail in FIG. 2. The joystick 22, as it relates to the common line 46 has three positions: $V_{BATT}$ (up/left), open (center), ground (down/right). It is preferred that the insulation resistance $R_{INS}$ of the joystick 22 and common line 46 exceed 10K ohms.

A PNP transistor Q1, preferably MMBTA56 and an NPN transistor, preferably MMBTA06, have coupled emitters at node 64 and bases at node 68. A resistor R5, preferably 330 ohms, connects the emitters 64 to the bases 68. A voltage divider circuit at node 68 preferably includes a pair of equal resistors R1 and R2, preferably 1K ohms, between $V_{BATT}$ and ground.

The collector of transistor Q1 is connected to ground by a resistor R3, which is complementary to a resistor R4 connecting the collector of transistor Q2 to $V_{BATT}$. Resistors R3 and R4 are preferably 10K ohms.

The voltages at nodes 74 and 76 are preferably reduced utilizing identical voltage divider circuits comprising resistors R6, R7, R8 and R9. R6 and R8 are preferably 100K ohms. R7 and R9 are preferably 150K ohms. The voltage divider circuit reduces the voltage at nodes 74 and 76 to a proper input voltage range to the micro-controller 40 which is preferably a MC68HC05B4CFN. It should be apparent that other microprocessor or digital logic devices could also be utilized.

In operation, when the joystick 22 connects line 46 to $V_{BATT}$, sufficient current into the three state switch detection circuit 60 through R5 creates sufficient negative base-emitter voltage to turn the PNP transistor Q1 on to saturation, thereby connecting the emitter 64 and collector 74, raising node 74 to $V_{BATT}$. Simultaneously, NPN transistor Q2 is switched off, thereby permitting node 76 to be raised substantially to $V_{BATT}$. Therefore, when the joystick 22 is in the $V_{BATT}$ (up/left) position, the micro-controller receives a binary "11" input.

Similarly, when joystick 22 is in the ground (down/right) position, sufficient current out of the three state switch detection circuit 60 through R5 creates sufficient positive base-emitter voltage to turn the NPN transistor Q2 on in saturation, thereby connecting the collector 76 and emitter 64 of transistor Q2 and bringing node 76 substantially to ground. Simultaneously PNP transistor Q1 is switched off, thereby permitting node 74 to be pulled substantially to ground through resistor R4. Therefore, the micro-controller receives a binary input of "00" when the joystick 22 is in the ground (down/right) position.

When the joystick 22 is in the open (center) position, there is little or no current through R5 other than some small current through $R_{INS}$. The voltage across R5, the base-emitter voltage, is zero or sufficiently low so that both transistor Q1 and transistor Q2 are switched off. Therefore, node 74 is pulled substantially to ground through resistor R3, while node 76 is pulled substantially to $V_{BATT}$ through resistor R4. Therefore, the micro-controller 40 will receive a binary "01" input, indicating that the joystick 22 is in the open (center) position.

It should be recognized that the specific circuit described above represents a circuit which is preferred for the particular application described. It should also be recognized that the circuit of the present invention could be utilized to convert any tri-state input to a two-bit binary output in other applications. Further, those skilled in the art will recognize that switches other than transistors could be utilized and that transistors other than bipolar junction transistors, such as MOSFET or JFET, could be utilized in the present invention. Further, specific resistor values and reference voltages are specified only as the preferred values for the particular application described. One having skill in the art would be able to tailor the circuit described above to operate in the desired application.

In accordance with the provisions of the patent statutes, the present invention has been described in what is considered to represent a preferred embodiment. However, it should be noted that the invention can be practiced otherwise than as specifically illustrated and described without departing from its spirit or scope.

What is claimed is:

1. A circuit for converting a three state input to a two-bit binary output comprising:
    a first switch connecting a first output to said input when said input is high, said first output connected to a first reference voltage; and
    a second switch connecting a second output to said input when said input is low, said second output connected to a second reference voltage.

2. The circuit of claim 1 wherein said first output is substantially equal to said first reference voltage when said input is an open circuit and said second output is substantially equal to said second reference voltage when said input is an open circuit.

3. The circuit of claim 1 wherein said first output is connected to ground by a resistor.

4. The circuit of claim 1 wherein said second output is connected to a positive voltage by a resistor.

5. The circuit of claim 1 wherein said switches are transistors.

6. The circuit of claim 1 wherein said switches are complementary transistors.

7. The circuit of claim 1 wherein said first switch is a pnp transistor and said second switch is an npn transistor,
    said pnp transistor having a first emitter, a first base and a first collector, said first collector and said first base are coupled to a reference voltage;

said npn transistor having a second emitter, a second base and a second collector, said second emitter coupled to said first emitter of said pnp transistor, said second base coupled to said reference voltage; and said bases of said transistors being connected to said emitters of said transistors.

8. The circuit of claim 7 wherein said first base is connected to said second base.

9. A circuit for controlling a motor-driven feature in a vehicle comprising:

a first motor for operating a motor-driven feature, said first motor having a first input line and a second input line;

a user switch for operating said first motor, said user switch having a low state, a high state and an open state;

a tri-state detection circuit receiving a tri-state signal from said user switch and converting said tri-state signal into a two-bit binary signal, said two-bit binary signal comprising a first bit and a second bit indicating the state of said user switch, said tri-state detection circuit including a first switch and a second switch, said first switch connecting said first bit to said user switch when said user switch is in said high state, said second switch connecting said second bit to said user switch when said user switch is in said low state; and a controller receiving said two-bit binary signal from said tri-state detection circuit, said controller operating said first motor to a stored setting for said motor-driven feature only when said two-bit binary signal indicates that said user switch is in said open state.

10. The circuit of claim 9 wherein said first bit is connected to a first reference voltage and said second bit is connected to a second reference voltage.

11. The circuit of claim 9 wherein said first switch is a pnp transistor and said second switch is an npn transistor, said pnp transistor having a first emitter, a first base and a first collector, said first collector and said first base are coupled to a reference voltage;

said npn transistor having a second emitter, a second base and a second collector, said second emitter coupled to said first emitter of said pnp transistor, said second base coupled to said reference voltage; and said bases of said transistors being connected to said emitters of said transistors by at least one resistor.

12. The circuit of claim 11 wherein said first collector is connected to ground by a first resistor, said second collector connected to a positive voltage by a second resistor.

13. The circuit of claim 11 wherein said first base is connected to said second base.

14. A method for converting a three state input to a two-bit binary output including the steps of:

connecting said input to a first output when said input is high;

connecting said input to a second output when said input is low;

connecting said first output to a first reference voltage when said input is low;

connecting said first output to said first reference voltage when said input is open;

connecting said second output to a second reference voltage when said output is high; and connecting said second output to said second reference voltage when said output is open.

15. The method of claim 14 further including the steps of:

connecting an emitter of a pnp transistor to said input, connecting a collector of said pnp transistor to ground by a first resistor; and connecting an emitter of an npn transistor to said input, connecting said emitter of said npn transistor to said emitter of said pnp transistor, connecting a base of said npn transistor to a base of said pnp transistor, connecting said bases of said transistors to said emitters of said transistors by a second resistor, connecting a collector of said npn transistor to a reference voltage by a resistor.

* * * * *